US008648365B2

(12) United States Patent
Won

(10) Patent No.: US 8,648,365 B2
(45) Date of Patent: Feb. 11, 2014

(54) LIGHTING EMITTING DEVICE PACKAGE

(75) Inventor: Jung Min Won, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 524 days.

(21) Appl. No.: 12/706,431

(22) Filed: Feb. 16, 2010

(65) Prior Publication Data

US 2010/0207152 A1 Aug. 19, 2010

(30) Foreign Application Priority Data

Feb. 17, 2009 (KR) .................. 10-2009-0013155

(51) Int. Cl.
*H01L 33/00* (2010.01)

(52) U.S. Cl.
USPC ............... 257/98; 257/E33.056; 257/E33.067

(58) Field of Classification Search
USPC .......................................................... 257/98
See application file for complete search history.

(56) References Cited

U.S. PATENT DOCUMENTS

| 6,184,544 | B1 * | 2/2001 | Toda et al. | 257/98 |
| 6,531,328 | B1 * | 3/2003 | Chen | 438/26 |
| 6,833,566 | B2 * | 12/2004 | Suehiro et al. | 257/99 |
| 7,129,576 | B2 * | 10/2006 | Humpston | 257/704 |
| 7,372,078 | B2 * | 5/2008 | Jang et al. | 257/98 |
| 7,518,158 | B2 * | 4/2009 | Keller et al. | 257/98 |
| 7,714,341 | B2 * | 5/2010 | Chil Keun et al. | 257/98 |
| 7,719,099 | B2 * | 5/2010 | Tseng et al. | 257/690 |
| 7,956,379 | B2 * | 6/2011 | Jeong et al. | 257/99 |
| 7,981,798 | B2 * | 7/2011 | Taguchi et al. | 438/675 |
| 8,048,694 | B2 * | 11/2011 | Wen et al. | 438/26 |
| 2004/0196877 | A1 * | 10/2004 | Kawakami et al. | 372/23 |
| 2005/0139846 | A1 | 6/2005 | Park et al. | |
| 2006/0057751 | A1 * | 3/2006 | Shen | 438/22 |
| 2006/0198162 | A1 * | 9/2006 | Ishidu et al. | 362/623 |
| 2006/0208271 | A1 * | 9/2006 | Kim et al. | 257/100 |
| 2006/0220036 | A1 * | 10/2006 | Lee et al. | 257/81 |
| 2006/0261364 | A1 * | 11/2006 | Suehiro et al. | 257/100 |
| 2007/0090510 | A1 * | 4/2007 | Tseng et al. | 257/690 |
| 2007/0114552 | A1 * | 5/2007 | Jang et al. | 257/98 |
| 2007/0145383 | A1 | 6/2007 | Rho et al. | |
| 2007/0161211 | A1 * | 7/2007 | Sunohara et al. | 438/455 |
| 2007/0164303 | A1 * | 7/2007 | Ho | 257/99 |
| 2007/0170448 | A1 * | 7/2007 | Ito et al. | 257/98 |

(Continued)

FOREIGN PATENT DOCUMENTS

| EP | 1876653 A2 | 1/2008 |
| KR | 10-0593937 B1 | 6/2006 |

(Continued)

*Primary Examiner* — N Drew Richards
*Assistant Examiner* — Ankush Singal
(74) *Attorney, Agent, or Firm* — Birch, Stewart, Kolasch & Birch, LLP

(57) ABSTRACT

Disclosed is a light emitting device package. The light emitting device package includes a package body including a cavity formed therein with first and second via holes, a first electrode extending from one side of the cavity to one side of a rear surface of the package body through the first via hole, a second electrode extending from an opposite side of the cavity to an opposite side of the rear surface of the package body through the second via hole, a light emitting device connected with the first and second electrodes, an insulating layer insulating the first and second electrodes from the package body, and a reflective layer disposed on the insulating layer having a structure in which first and second media having different refractive indexes are alternately stacked on each other.

16 Claims, 10 Drawing Sheets

(56) References Cited

U.S. PATENT DOCUMENTS

| | | | |
|---|---|---|---|
| 2007/0170454 A1* | 7/2007 | Andrews | 257/100 |
| 2007/0194712 A1* | 8/2007 | Shiraishi et al. | 313/512 |
| 2007/0221928 A1* | 9/2007 | Lee et al. | 257/79 |
| 2007/0246724 A1* | 10/2007 | Wen et al. | 257/98 |
| 2008/0006837 A1 | 1/2008 | Park et al. | |
| 2008/0043444 A1 | 2/2008 | Hasegawa et al. | |
| 2008/0149962 A1* | 6/2008 | Kim et al. | 257/99 |
| 2008/0179605 A1* | 7/2008 | Takase et al. | 257/94 |
| 2008/0185605 A1* | 8/2008 | Wada et al. | 257/98 |
| 2008/0191227 A1* | 8/2008 | Kimura et al. | 257/98 |
| 2008/0197370 A1* | 8/2008 | Lin et al. | 257/98 |
| 2008/0212630 A1* | 9/2008 | Otake et al. | 372/44.01 |
| 2008/0280161 A1* | 11/2008 | Jang et al. | 428/690 |
| 2008/0315230 A1* | 12/2008 | Murayama | 257/98 |
| 2009/0032832 A1* | 2/2009 | Lin et al. | 257/98 |
| 2009/0090926 A1* | 4/2009 | Wang et al. | 257/99 |
| 2009/0146155 A1* | 6/2009 | Wang et al. | 257/82 |
| 2009/0166664 A1* | 7/2009 | Park et al. | 257/99 |
| 2009/0179215 A1* | 7/2009 | Matsui et al. | 257/98 |
| 2009/0244740 A1* | 10/2009 | Takayanagi et al. | 359/839 |
| 2009/0274188 A1* | 11/2009 | Jang et al. | 372/50.1 |

FOREIGN PATENT DOCUMENTS

| | | | | |
|---|---|---|---|---|
| KR | 20050052196 | * | 8/2006 | H01L 33/00 |
| KR | 10-2007-0050159 A | | 5/2007 | |
| KR | 10-2007-0074460 A | | 7/2007 | |
| KR | 10-2008-0051877 A | | 6/2008 | |
| WO | WO-2008/059650 A1 | | 5/2008 | |

* cited by examiner

LIGHTING EMITTING DEVICE PACKAGE

CROSS-REFERENCE TO RELATED APPLICATIONS

The present application claims the benefit under 35 U.S.C. §119 of Korean Patent Application No. 10-2009-0013155, filed Feb. 17, 2009, which is hereby incorporated by reference in its entirety.

BACKGROUND

The embodiment relates to a light emitting device package and a method of manufacturing the same.

A light emitting diode (LED) may include a GaAs-based, AlGaAs-based, GaN-based, InGaN-based or InGaAlP-based compound semiconductor.

The LED is packaged such that the LED is used as a light emitting device capable of emitting various color light. Such a light emitting device is used as a light source in various fields, such as a lightening indicator for expressing colors, a character indicator, a backlight unit, an image indicator, and an illumination device.

SUMMARY

The embodiment provides a light emitting device package and a method of manufacturing the same.

According to the embodiment, a light emitting device package includes a package body including a cavity formed therein with first and second via holes, a first electrode extending from one side of the cavity to one side of a rear surface of the package body through the first via hole, a second electrode extending from an opposite side of the cavity to an opposite side of the rear surface of the package body through the second via hole, a light emitting device connected with the first and second electrodes, an insulating layer insulating the first and second electrodes from the package body, and a reflective layer disposed on the insulating layer having a structure in which first and second media having different refractive indexes are alternately stacked on each other.

According to the embodiment, a light emitting device package includes a package body formed therein with first and second via holes, a first electrode formed at one side of an upper portion of the package body and through the first via hole, a second electrode formed at an opposite side of the upper portion of the package body and through the second via hole, a light emitting device connected with the first and second electrodes, an insulating layer insulating the first and second electrodes from the package body, a reflective layer disposed on the insulating layer and having a structure in which first and second media having different refractive indexes are alternately stacked, and a via plug extending downward through the package body and disposed below the light emitting device.

According to the embodiment, a method of manufacturing a light emitting device package is as follows. First and second via holes are formed in a cavity of a package body. An insulating layer is formed on top and bottom surfaces of the package body and in the first and second via holes. A first electrode is formed in the cavity, on the bottom surface of the package body, and in the first vial hole. A second electrode is formed in the cavity, on the bottom surface of the package body, and in the second via hole. A light emitting device is disposed on the first and second electrodes.

According to the embodiment, light efficiency can be improved.

According to the embodiment, luminous intensity can be improved in a wafer level package (WLP).

According to the embodiment, after forming an electrode in a portion of a light emitting device mounting area and a cavity, the electrode can be connected with an external device through a via structure, so that heat sink can be effectively achieved.

According to the embodiment, the light emitting device is surrounded by the reflective layer having a structure in media including different metal materials are alternately stacked, thereby improving light efficiency.

DETAILED DESCRIPTION OF THE EMBODIMENTS

Figure 1:
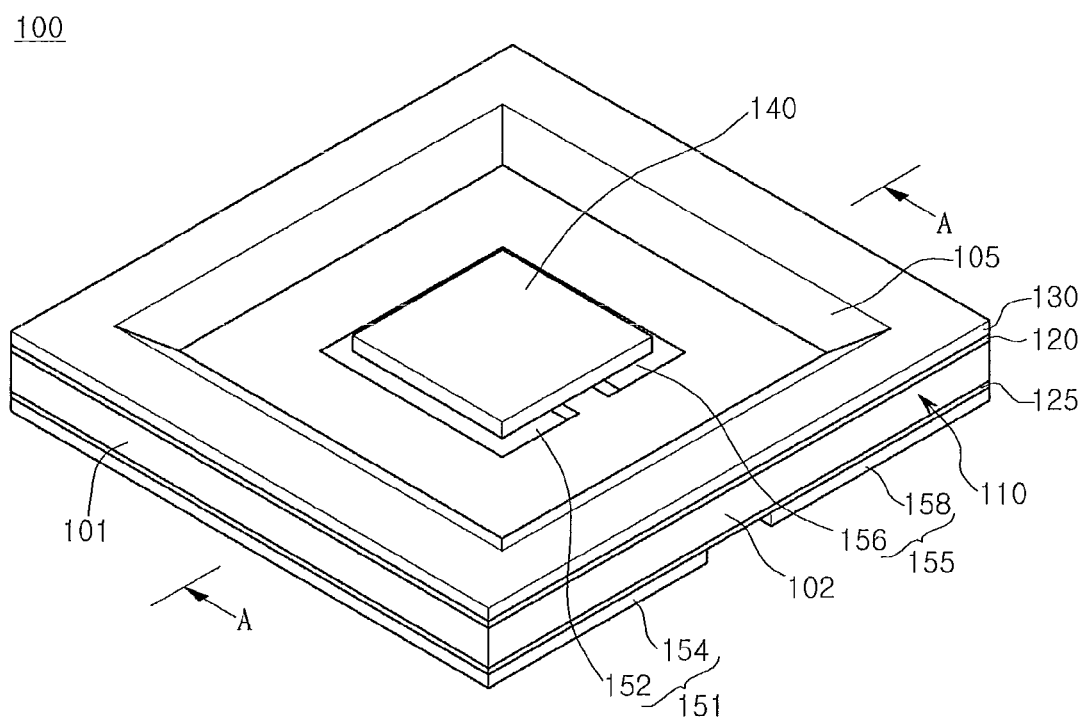
FIG. 1 is a perspective view showing a light emitting device package according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings can be exaggerated, omitted or schematically drawn for the purpose of convenience or clarity. In addition, the size of elements does not utterly reflect an actual size.

Hereinafter, embodiments will be described with reference to accompanying drawings.

Figure 2:
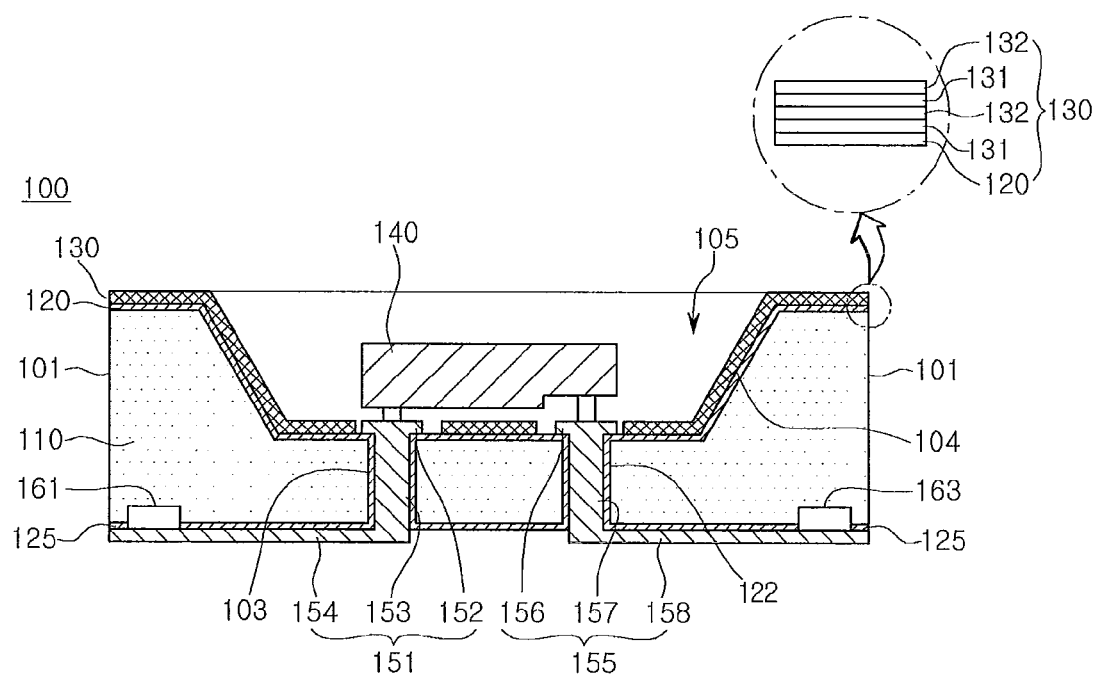
FIG. 2 is a sectional view taken along line A-A of FIG. 1.

FIG. 1 is a perspective view showing a light emitting device package 100 according to a first embodiment, and FIG. 2 is a sectional view taken along line A-A of FIG. 1

Referring to FIGS. 1 and 2, the light emitting device package 100 according to the embodiment includes a package body 110, insulating layers 120 and 125, a reflective layer 130, a light emitting device 140, a first electrode 151, and a second electrode 155.

The package body 110 may be formed in a wafer level package (WLP) including silicon. A cavity 105 having a predetermined depth is formed at an upper portion of the package body 110. The cavity 105 may have one of a bathtub shape, a polygonal shape, and a circular shape. A side surface 104 forming the cavity 105 is inclined outward from an axis perpendicular to a bottom surface at a predetermined angle.

Although the package body 110 is shown in a single chip unit, the package body 110 is manufactured on a silicon wafer in the form of a matrix and then cut away from the silicon wafer. An outer surface 101 of the package body 110 may be a non-inclined surface.

The package body 110 is not connected with a metallic layer through the outer surface 101, but connected with the metallic layer through a via. Accordingly, the use amount of metal can be reduced.

The insulating layers 120 and 125 are formed on top and bottom surfaces of the package body 110, respectively. The insulating layers 120 and 125 may include various insulating materials such as an oxide layer, a silicon thermal oxide layer, AlN, SiC, alumina, and a silicon nitride, but the embodiment is not limited thereto.

The first and second electrodes 151 and 155 connect a rear surface of the package body 110 with the cavity 105 through a via structure.

The first electrode 151 includes a first upper electrode 152, a first via electrode 153, and a first lower electrode 154, and the second electrode 155 includes a second upper electrode 156, a second via electrode 157, and a second lower electrode 158.

The first and second upper electrodes 152 and 156 are spaced apart from each other in the cavity area 105 in which the light emitting device 140 is installed. One end of the first via electrode 153 is connected with the first upper electrode 152, and an opposite end of the via electrode 153 is connected with the first lower electrode 154. One end of the second via electrode 157 is connected with the second upper electrode 156, and an opposite end of the second via electrode 157 is connected with the second lower electrode 158.

The first and second via electrodes 153 and 157 are insulated from the package body 110 by the insulating layer 122. A single via electrode or a plurality of via electrodes may be formed.

A via hole 103 in which the first and second via electrodes 153 and 157 are formed may have a circular column shape or a polygonal column shape. The via hole 103 may have a predetermined area capable of improving a heat sink efficiency.

At least one light emitting device 140 may be disposed in the cavity 105 of the package body 110. The light emitting device 140 may be connected with the first and second upper electrodes 152 and 156 through a flip-chip bonding scheme using a bump.

The light emitting device 140 may include a color LED chip such as a blue, green, red, or yellow LED chip, or an ultraviolet LED chip. The embodiment does not restrict the type or the number of light emitting devices 140.

The reflective layer 130 is formed on the top surface of the package body 110. The reflective layer 130 may have a structure in which first and second media 131 and 132 having different refractive indexes are alternately stacked on each other.

The first medium 131 may include non-metal having a lower refractive index, and the second medium 132 may include non-metal having a higher refractive index. The first medium 131 may include one selected from among $Al_2O_3$, $SiO_2$, and $Fe_2O_3$. The second medium 132 may include $TiO_2$. The $TiO_2$ causes different indexes according to crystalline directions.

The reflective layer 130 may have a stacked structure of 4 to 15 pairs of the first and second media 131 and 132. The first medium 131 may have a thickness of 650 Å to 1300 Å, and the second medium 132 may have a thickness of 450 Å to 900 Å. In this case, when a pair of $Al_2O_3/TiO_2$ is stacked, the thickness of each medium may be varied depending on light emitting wavelengths of the light emitting device 100. For example, in the case of a blue wavelength, the thickness of the $Al_2O_3$ is in the range of 680 Å to 730 Å, and the thickness of the $TiO_2$ is in the range of 480 Å to 515 Å. In the case of a green wavelength, the thickness of the $Al_2O_3$ is in the range of 803 Å to 865 Å, and the thickness of the $TiO_2$ is in the range of 570 Å to 610 Å. In the case of a red wavelength, the thickness of each medium is in the range of 800 Å to 1200 Å. In this case, 5 to 10 pairs of $Al_2O_3/TiO_2$ may be formed based on light reflectivity. The reflective layer 130 having the above structure has reflectivity higher than that of Ag, so that light reflective efficiency can be improved.

First and second doped layers 161 and 163 may be formed in the package body 110. The first and second doped layers 161 and 163 may be selectively formed on a top surface or a bottom surface of the package body 110. In addition, the first and second doped layers 161 and 163 may be formed by diffusing or implanting impurities having a polarity opposite to that of the package body 110.

If the first and second doped layers 161 and 163 are formed on the bottom surface of the package body 110, the first doped layer 161 may be connected between the package body 110 and the first lower electrode 154, and the second doped layer 163 may be connected between the package body 110 and the second lower electrode 158. The first and second doped layers 161 and 163 may include a zener diode.

A resin member may be formed in the cavity 105. The resin member may include transparent silicon or epoxy. At least one kind of fluorescent substance may be added to the resin member.

A lens may be formed over the cavity 105 or the resin member. The lens may include a convex lens or a lens manufactured through a transfer molding scheme.

Figure 3:
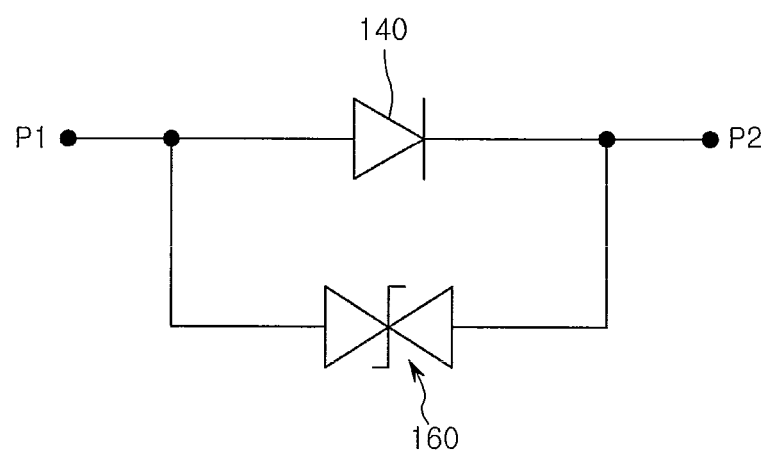
FIG. 3 is a circuit diagram of FIG. 1.

FIG. 3 is a circuit diagram of the light emitting device package according to the first embodiment.

Referring to FIG. 3, the light emitting device 140 may be connected with a zener diode 160 in parallel. First and second electrodes P1 and P2 may be connected with both ends of the light emitting device 140 and the zener diode 160.

The zener diode 160 is represented as a bi-directional zener diode having a bi-directional threshold voltage. However, the zener diode 160 may have various structures, and may be selectively realized in the package body 110.

Figure 4:
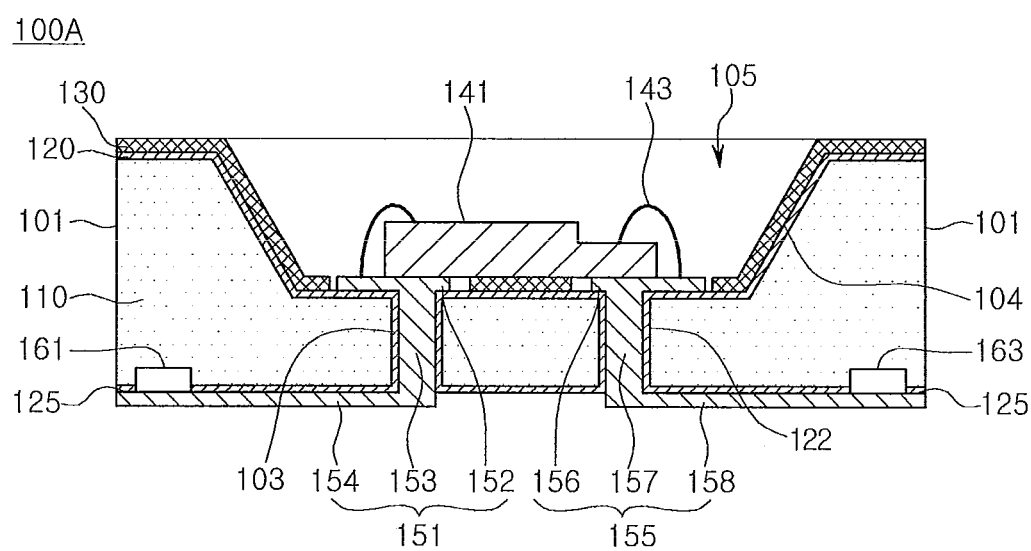
FIG. 4 is a sectional view showing a light emitting device package according to a second embodiment.

FIG. 4 is a sectional view showing a light emitting device package 100A according to a second embodiment. In the following description, the same reference numerals will be assigned to elements the same as those of the first embodiment in order to avoid redundancy.

Referring to FIG. 4, in the light emitting device package 100A according to the embodiment, a light emitting device 141 is connected with the first upper electrode 152 of the first electrode 151 through a wire, and connected with the second upper electrode 156 of the second electrode 155 through a wire 143.

Figure 5:
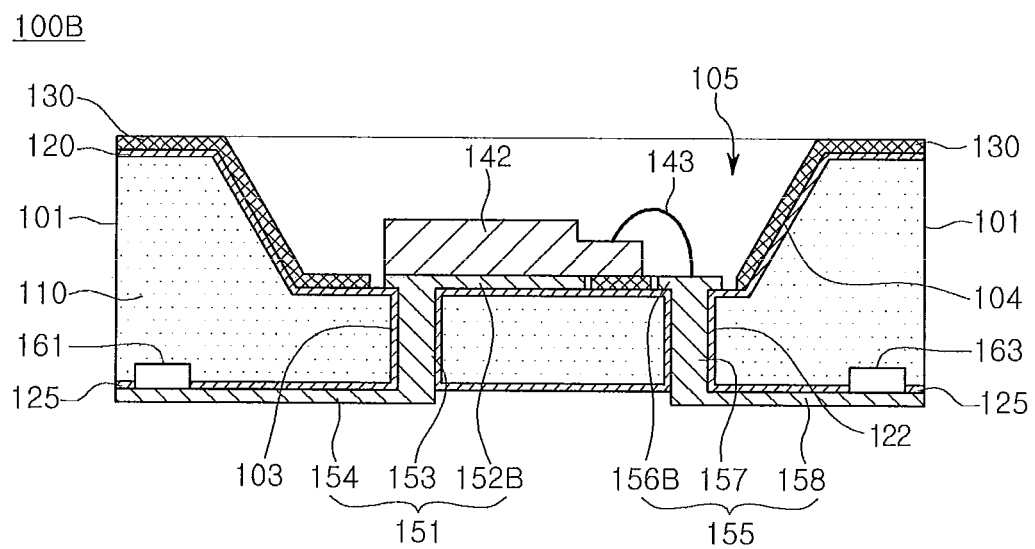
FIG. 5 is a sectional view showing a light emitting device package according to a third embodiment.

FIG. 5 is a sectional view showing a light emitting device package 100B according to a third embodiment. In the following description, the same reference numerals will be assigned to elements the same as those of the first embodiment in order to avoid redundancy.

Referring to FIG. 5, in the light emitting device package 100B according to the embodiment, a light emitting device 142 is connected with a first upper electrode 152B of the first electrode 151 through die-bonding, and connected with a second upper electrode 156B of the second electrode 155 through the wire 143.

Figure 6:
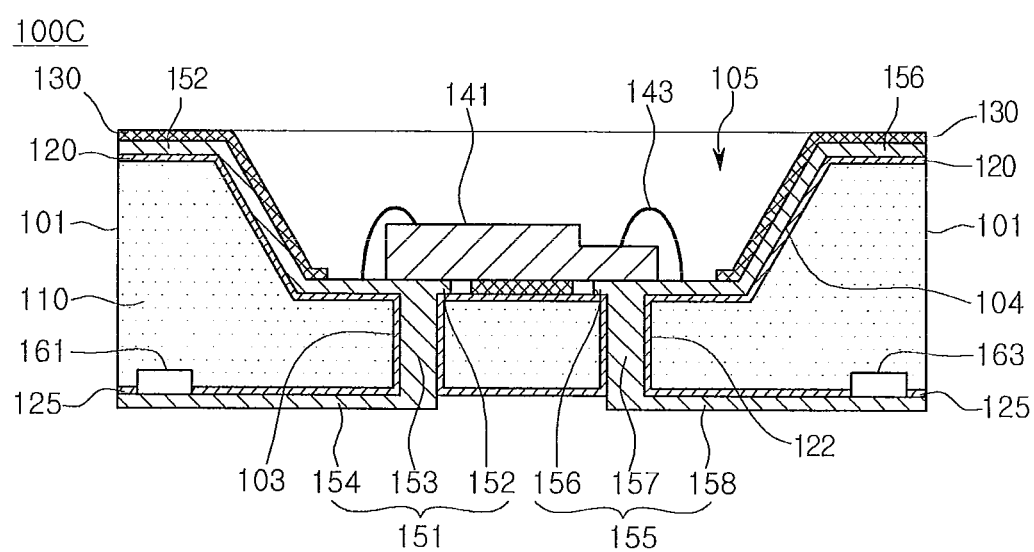
FIG. 6 is a sectional view showing a light emitting device package according to a fourth embodiment.

FIG. 6 is a sectional view showing a light emitting device package 100C according to a fourth embodiment. In the following description, the same reference numerals will be assigned to elements the same as those of the second embodiment in order to avoid redundancy.

Referring to FIG. 6, in the light emitting device package 100C according to the embodiment, the first and second upper electrodes 152 and 156 extend in the package body 110. In other words, the first and second upper electrodes 152 and 156 are disposed on an inclined surface and an upper portion of the package body 110, thereby further improving reflective efficiency.

Figure 7:
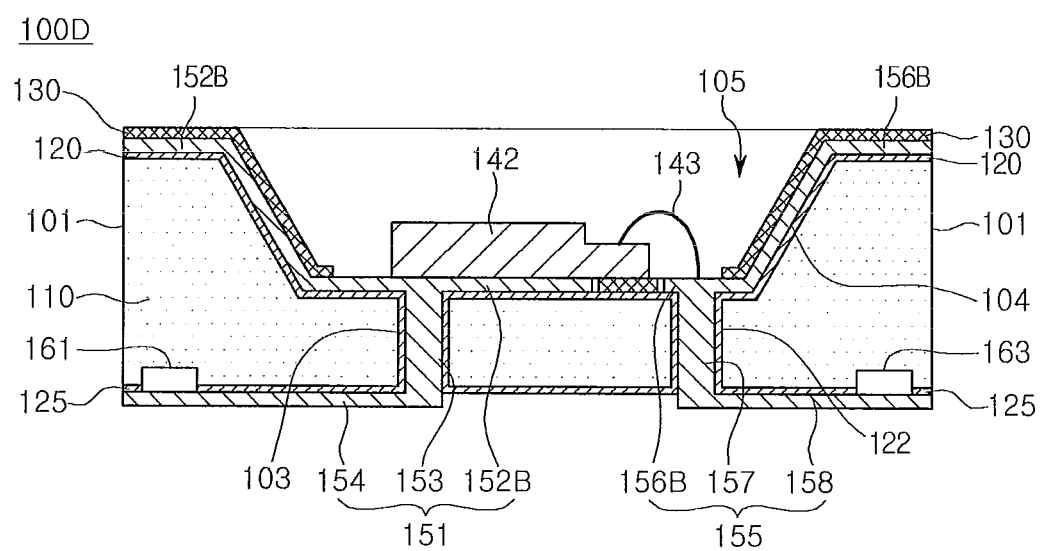
FIG. 7 is a sectional view showing a light emitting device package according to a fifth embodiment.

FIG. 7 is a sectional view showing a light emitting device package 100D according to a fifth embodiment. In the following description, the same reference numerals will be assigned to elements the same as those of the third embodiment in order to avoid redundancy.

Referring to FIG. 7, in the light emitting device package 100D according to the embodiment, the first and second upper electrodes 152B and 156B extend in the package body 110. In other words, the first and second upper electrodes 152B and 156B are disposed on an inclined surface and an upper portion of the package body 110, thereby further improving reflective efficiency.

Figure 8:
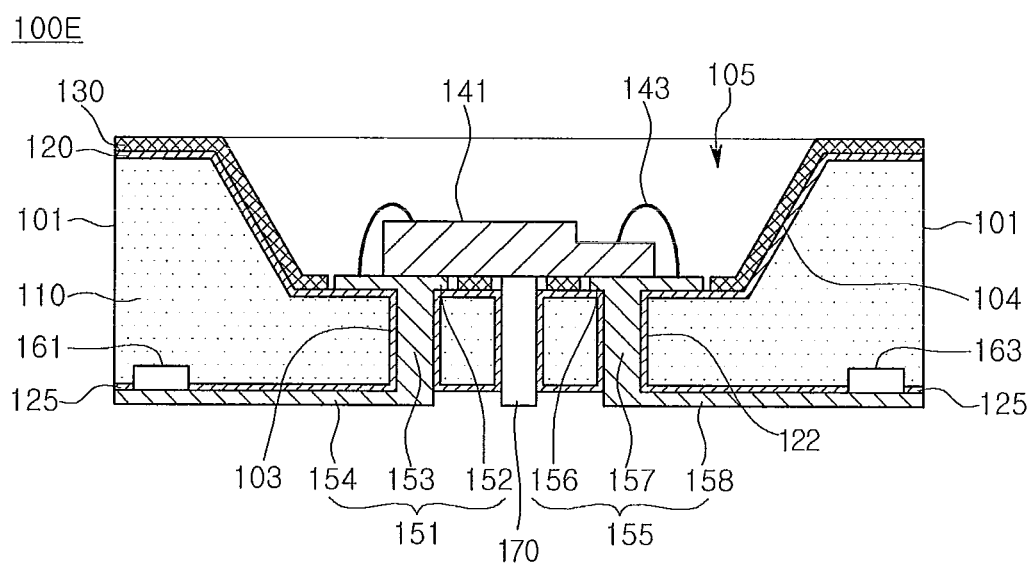
FIG. 8 is a sectional view showing a light emitting device package according to a sixth embodiment.

FIG. 8 is a sectional view showing a light emitting device package 100E according to a sixth embodiment. In the following description, the same reference numerals will be assigned to elements the same as those of the second embodiment in order to avoid redundancy.

Referring to FIG. 8, in the light emitting device package 100E according to the embodiment, a via plug 170 may be disposed at a lower portion of the package body 110. The via plug 170 may include a metallic material. Accordingly, the via plug 170 can discharge heat generated from the light emitting device 141, so that a heat sink characteristic can be improved.

Figure 9:
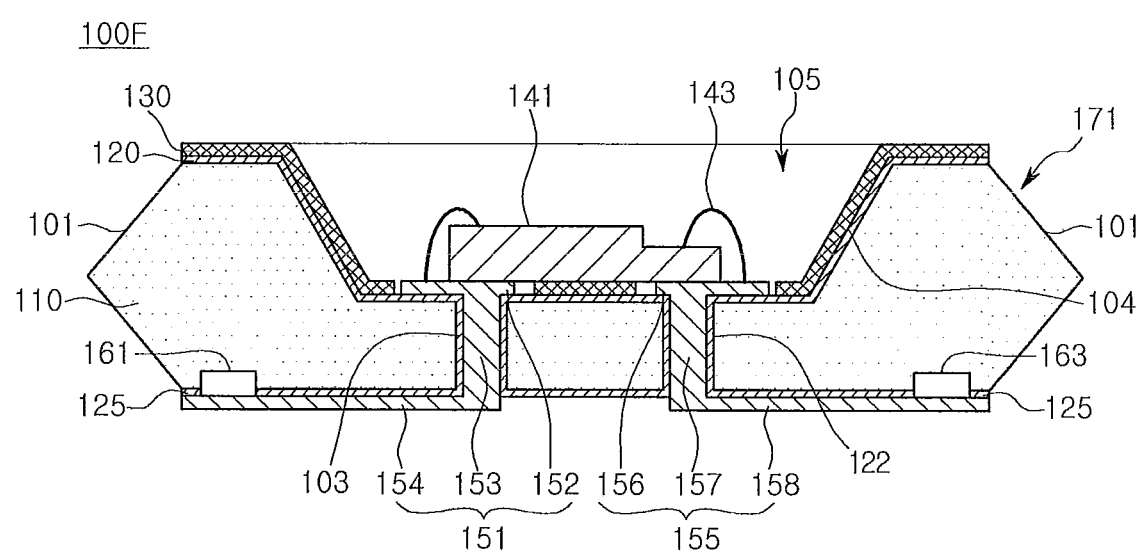
FIG. 9 is a sectional view showing a light emitting device package according to a seventh embodiment.

FIG. 9 is a sectional view showing a light emitting device package 100F according to a seventh embodiment. In the following description, the same reference numerals will be assigned to elements the same as those of the second embodiment in order to avoid redundancy.

Referring to FIG. 9, in the light emitting device package 100F according to the embodiment, inclined surfaces 171 are formed at both ends of the package body 110. Although the previous embodiments have been described in that both ends of the package body 110 are not inclined, both ends of the package body 110 according to the previous embodiments may have the inclined surfaces 171 as shown in FIG. 9.

Figure 10:
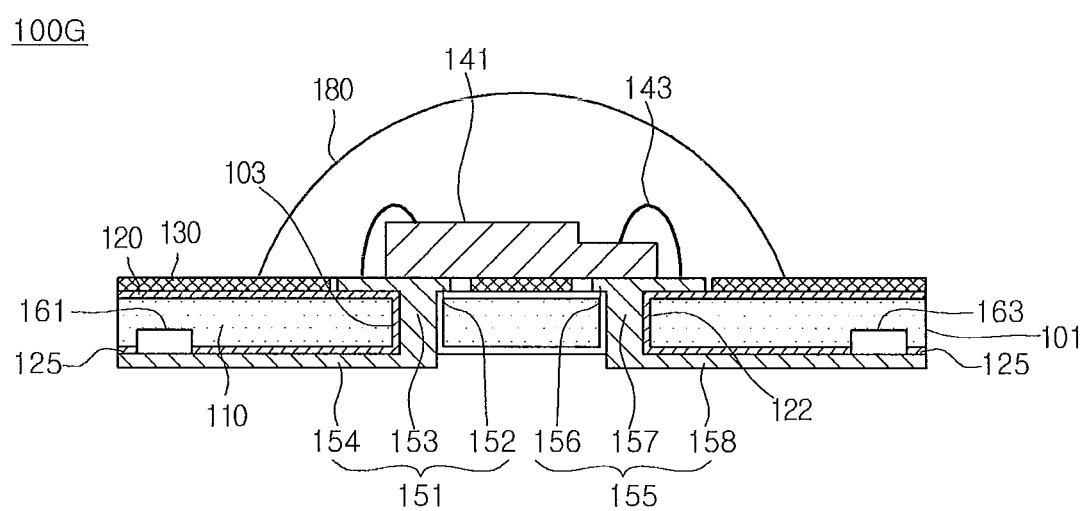
FIG. 10 is a sectional view showing a light emitting device package according to an eighth embodiment.

FIG. 10 is a sectional view showing a light emitting device package 100G according to an eighth embodiment. In the following description, the same reference numerals will be assigned to elements the same as those of the second embodiment in order to avoid redundancy.

Referring to FIG. 10, the light emitting device package 100G according to the embodiment makes a difference from the previous embodiments in that the light emitting device package 100G includes the package body 110 having a plane shape. For example, the package body 110 may be realized by using a silicon substrate. A molding part 180 may be further formed on the light emitting device 141. The molding part 180 may be made of resin. The molding part 180 may be made of transparent silicon or epoxy. The molding part 180 may include a fluorescent substance. The molding part 180 may have the shape of a lens. In addition, the molding part 180 may have the shape of a spherical lens or the shape of the aspherical lens.

In addition, according to another embodiment, the first and second upper electrodes 152 and 156 may extend to both ends of the package body 110. Accordingly, the first and second upper electrodes 152 and 156 are formed below the reflective layer 130, thereby further improving reflective efficiency.

The above-described light emitting device package is variously adaptable for a backlight unit, an illumination device, and so on.

The backlight unit can be adapted to a display apparatus such as a liquid crystal display to supply light to the display apparatus. The backlight unit may include a light supply part, a light guide plate, and an optical sheet. The light emitting device package according to the embodiments can be adapted to the light supply part. The backlight unit may not employ the light guide plate.

The illumination device may include a case and a light supply module. The light supply module may be disposed in the case. The light emitting device package according to the embodiments can be adapted to the light supply module.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a package body including a cavity formed therein with first and second via holes;
   a first electrode extending from one side of the cavity to one side of a rear surface of the package body through the first via hole;
   a second electrode extending from an opposite side of the cavity to an opposite side of the rear surface of the package body through the second via hole;
   a light emitting device connected with the first and second electrodes;
   an insulating layer insulating the first and second electrodes from the package body; and
   a reflective layer disposed on the insulating layer having a structure in which first and second media having different refractive indexes are alternately stacked on each other,
   wherein the reflective layer comprises a stacked structure of an $Al_2O_3$ layer and a $TiO_2$ layer, and
   wherein the light emitting device emits a light of blue wavelength, a thickness of the $Al_2O_3$ layer is in a range of about 680 Å to about 730 Å, and a thickness of the $TiO_2$, layer is in a range of about 480 Å to about 515 Å.

2. The light emitting device package of claim 1, wherein the insulating layer is formed on top and bottom surfaces of the package body and in the first and second via holes.

3. The light emitting device package of claim 1, wherein the package body is formed of silicon.

4. The light emitting device package of claim 1, wherein the reflective layer has a structure in which a pair of the first and second media are stacked four times to fifteenth times.

5. The light emitting device package of claim 1, wherein an outer surface of the package body is not inclined.

6. The light emitting device package of claim 1, wherein an outer surface of the package body is inclined.

7. The light emitting device package of claim 1, further comprising a zener diode disposed on a bottom surface of the package body.

8. The light emitting device package of claim 1, wherein the light emitting device is connected through at least one selected from flip-chip bonding, die-bonding, and wire bonding.

9. The light emitting device package of claim 1, wherein the first and second via holes have a circular shape or a polygonal shape.

10. The light emitting device package of claim 1, further comprising a first zener diode connected between the first electrode and the package body, and a second zener diode connected between the second electrode and the package body.

11. The light emitting device package of claim 1, wherein at least one of a resin member and a lens is formed over the cavity.

12. The light emitting device package of claim 1, further comprising a via plug extending downward through the package body and disposed below the light emitting device.

13. The light emitting device package of claim 1, wherein the first and second electrodes extend below the reflective layer.

14. The illumination device comprising the light emitting device package of claim 1.

15. A light emitting device package comprising:
a package body formed therein with first and second via holes;
a first electrode formed at one side of an upper portion of the package body and through the first via hole;
a second electrode formed at an opposite side of the upper portion of the package body and through the second via hole;
a light emitting device connected with the first and second electrodes;
an insulating layer insulating the first and second electrodes from the package body;
a reflective layer disposed on the insulating layer and having a structure in which first and second media having different refractive indexes are alternately stacked; and
a via plug extending downward through the package body and disposed below the light emitting device,
wherein the reflective layer comprises a stacked structure of an $Al_2O_3$ layer and a $TiO_2$ layer, and
wherein the light emitting device emits a light of blue wavelength, a thickness of the $Al_2O_3$ layer is in a range of about 680 Å to about 730 Å, and a thickness of the $TiO_2$ layer is in a range of about 480 Å to about 515 Å.

16. The light emitting device package of claim 15, wherein the reflective layer has a structure in which a pair of the first and second media are stacked four times to fifteenth times.

* * * * *